United States Patent
Hash et al.

(10) Patent No.: US 10,971,419 B2
(45) Date of Patent: Apr. 6, 2021

(54) METHOD AND APPARATUS FOR REDUCING NOISE ON INTEGRATED CIRCUIT USING BROKEN DIE SEAL

(71) Applicant: pSemi Corporation, San Diego, CA (US)

(72) Inventors: Bryan Lee Hash, Lake Zurich, IL (US); Ronald Eugene Reedy, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 128 days.

(21) Appl. No.: 16/252,396

(22) Filed: Jan. 18, 2019

(65) Prior Publication Data
US 2020/0235022 A1    Jul. 23, 2020

(51) Int. Cl.
| H01L 23/31 | (2006.01) |
|---|---|
| H01L 23/10 | (2006.01) |
| H01L 23/528 | (2006.01) |
| H01L 23/522 | (2006.01) |

(52) U.S. Cl.
CPC .......... *H01L 23/3121* (2013.01); *H01L 23/10* (2013.01); *H01L 23/3178* (2013.01); *H01L 23/528* (2013.01); *H01L 23/5226* (2013.01)

(58) Field of Classification Search
CPC . H01L 23/5226; H01L 23/3675; H01L 23/10; H01L 23/5329; H01L 23/5283; H01L 23/5386; H01L 23/13; H01L 23/3121; H01L 23/3178; H01L 23/528; H01L 23/562; H01L 23/585
See application file for complete search history.

(56) References Cited

U.S. PATENT DOCUMENTS

| 7,893,459 B2 | 2/2011 | Wang et al. | |
|---|---|---|---|
| 2011/0309465 A1* | 12/2011 | Chen | H01L 23/585 257/503 |
| 2016/0300800 A1* | 10/2016 | Zeng | H01L 23/585 |

* cited by examiner

*Primary Examiner* — Jasmine J Clark
(74) *Attorney, Agent, or Firm* — Jaquez Land Greenhaus LLP; Bruce W. Greenhaus, Esq.

(57) ABSTRACT

A die seal is broken in at least one place for a conductor strip formed on each conductor layer. Accordingly, no current can flow in a circular pattern around the entire perimeter of the chip. In some embodiments, an angled slot is provided in the original die seal. The angled slots may be vertically aligned. Alternatively, the slots may be vertically staggered or straight. When vertically staggered, the slots on each conductor layer are vertically offset.

20 Claims, 18 Drawing Sheets

SECTION C-C

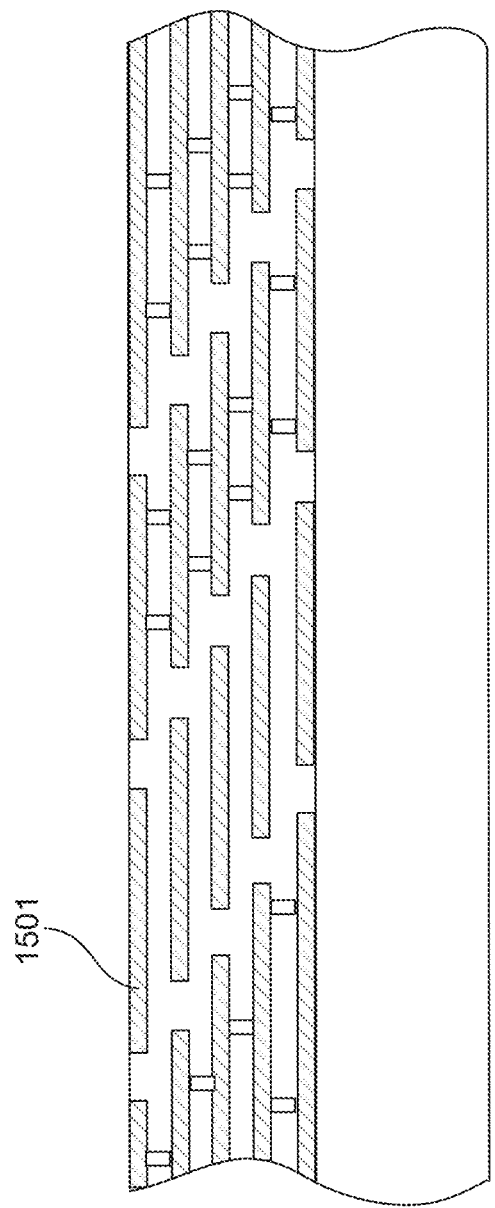

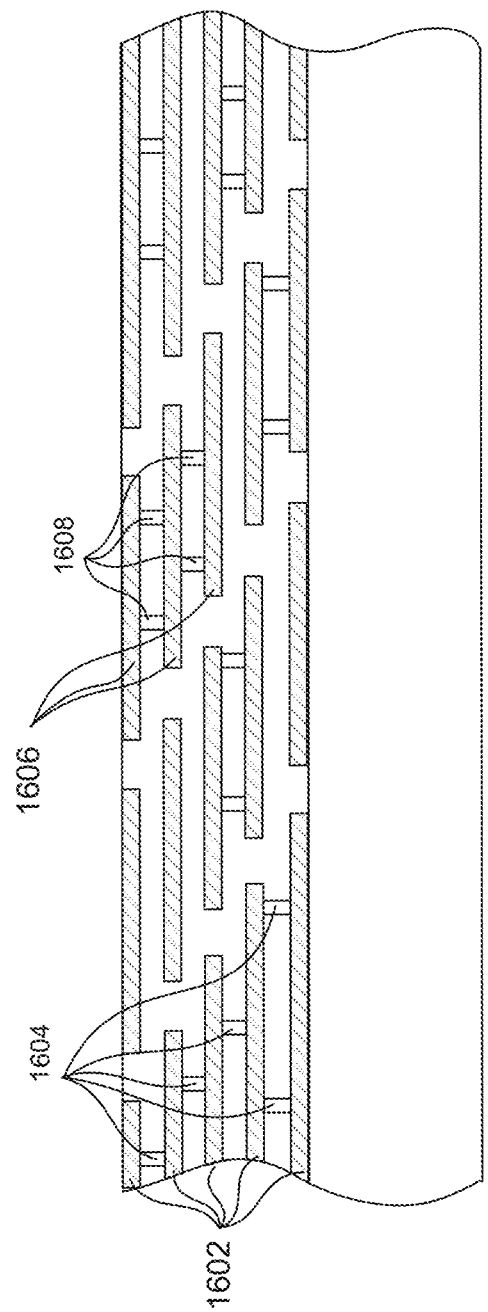

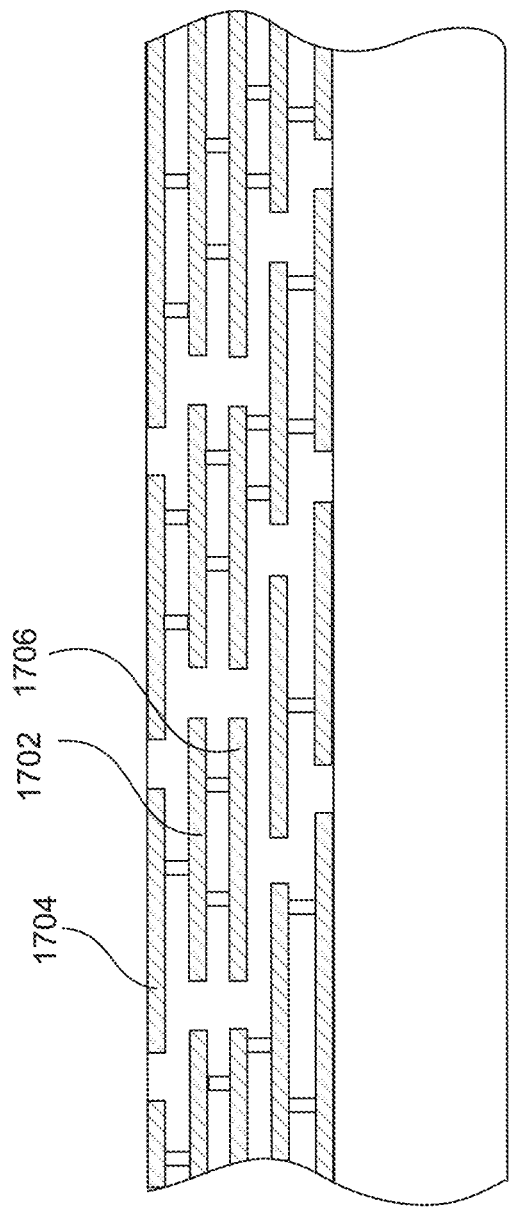

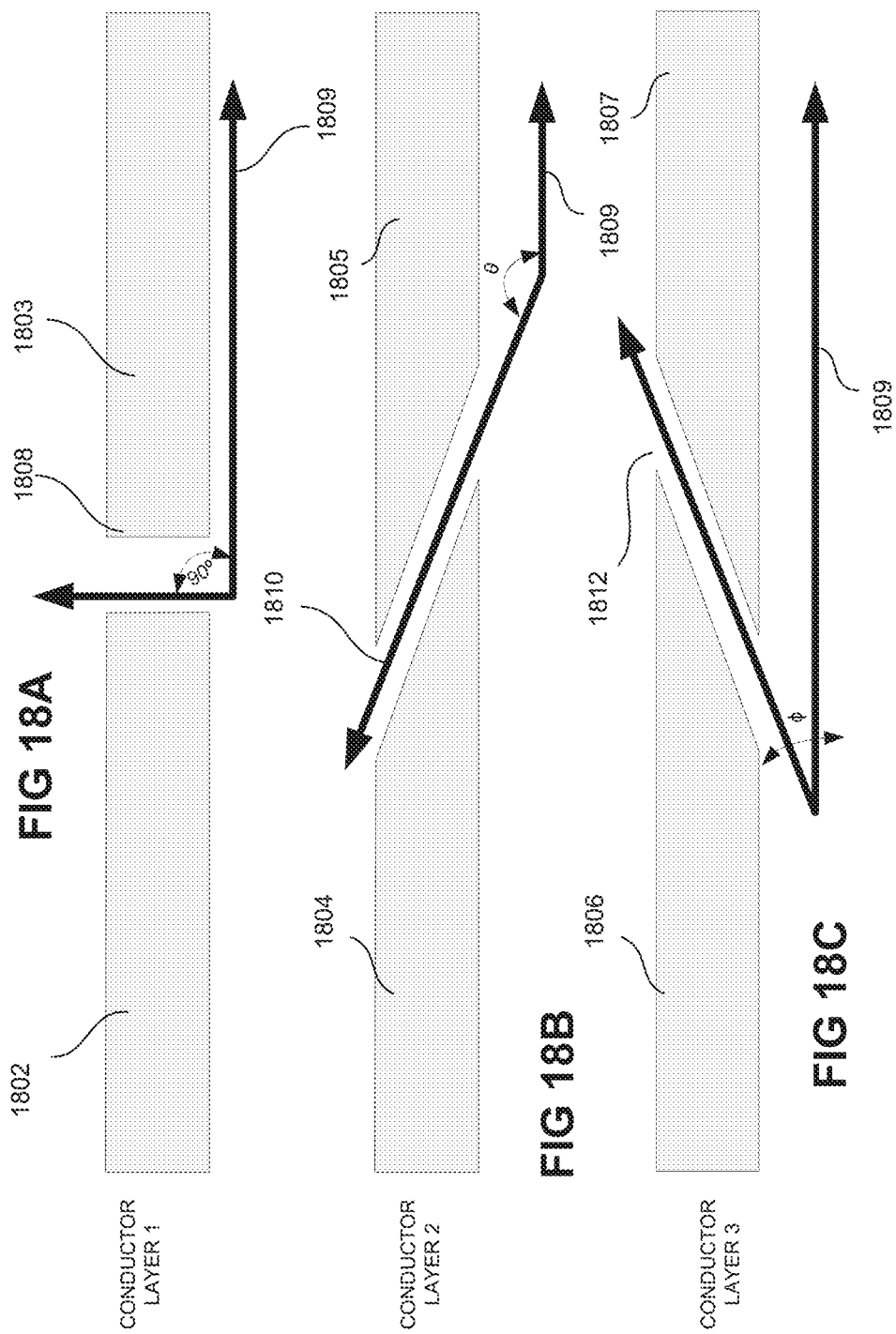

METHOD AND APPARATUS FOR REDUCING NOISE ON INTEGRATED CIRCUIT USING BROKEN DIE SEAL

BACKGROUND

(1) Technical Field

Various embodiments described herein relate die seals in integrated circuits and more particularly to methods and die seal configurations for reducing induced noise carried along a die seal of an integrated circuit.

(2) Background

In many cases, it is advantageous to use die seals in the manufacture of semiconductors. A die seal can provide protection from damage to a substrate of a semiconductor (and associated circuitry) of an integrated circuit, particularly in the process of dicing a wafer in to chips. More particularly, the die seal protects the substrate and internal circuits of a semiconductor chip from structural stresses that occur when dicing the semiconductor wafers into integrated circuit chips. Once the wafer is diced, each of the pieces of the original wafer is called a "die". Metal lines deposited on the semiconductor typically form the die seals.

FIG. 1 is a plan view of a die seal 101 having a width "W". Die seals 101 are typically formed on an inner side of dicing line 102, sometimes also referred to as a scribe street. Typically, microelectronic circuitry is located inside the die seal. The scribe street 102 lies outside the die seal and is located between adjacent dice.

FIG. 2 is a cross section of a portion of the die seal of FIG. 1. Die seals 101 include metal lines 104. In many cases, conductive vias 108 are provided that electrically and mechanically connect the different metal layers of the die seal 101. The lines 104 and vias 108 are both formed in dielectric layers 106. In some cases, a passivation film is formed over a top layer of die seal 101, and down to the substrate surface, often comprised of a silicon nitride or oxynitride layer, both of which are very good diffusion barriers.

The die seal 101 protects the structures on the interior of the chip (i.e., those structures that lie within the chip when the wafer is diced into chips) from the influences of the external environment. Therefore, the die seal provides stable properties for the semiconductor device over time. Die seals are usually grounded, either by one or more dedicated connections or by connecting the die seal to a circuit ground using a strip of metal. However, in some cases, die seals are not connected electrically to other circuits on the chip.

One function of die seals 101 is to terminate any physical cracks penetrating from the die edge into the die interior, thereby protecting the integrated circuits from moisture-induced or contamination-induced degradation. Thus, the moisture or other contaminant penetration into the sensitive circuitry is significantly reduced or eliminated.

The die seal 101 shown in prior art FIG. 1 is an unbroken ring around the die and allows induced currents to circulate around the die seal. This can result in induced noise in circuits fabricated on the chip, especially when the die seal is grounded, creating a path for these currents to couple into the circuitry. FIG. 3 shows a prior art die seal which breaks the die seal with a straight slot 301. In order to ensure that cracks that might form during a cutting operation do not propagate through the straight slot 301, at least a portion of a parallel conductor strip 303, 305 is provided. Providing such a parallel conductor strip decreases the amount of area available for fabricating circuits on the chip. If placed outside the die seal 300, as is the case with the conductor strip 305 shown in FIG. 3, a larger chip is needed to accommodate the additional conductor strip 305. Both of these parallel conductor strips, 303 and 305 increase cost.

SUMMARY OF THE INVENTION

A die seal comprising conductor strips formed on each conductor layer is broken in at least one place so no current can flow in a circular pattern around the entire perimeter of the chip in a Faraday ring that would otherwise be presented around an otherwise continuous die seal. In some embodiments, an angled slot is provided in the original die seal. In such embodiments, the angled slots may be vertically aligned. In other embodiments, in which the slots are vertically staggered (i.e., not vertically aligned), the slots may be made straight, as opposed to angled. In embodiments in which the slots are vertically staggered, the slots on each conductor layer are vertically offset such that each slot in each conductor layer has a conductor both on top and below it to ensure that the die seal will perform the desired function. In addition to preventing edge crack propagation, a relatively zero angle slot can be formed at each conductor layer, allowing the distance between vias (i.e., via pitch) to be minimally impacted.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 15 is a cross sectional view F-F similar to that of FIG. 14, but in which each of the conductor strips of at least one group of conductor strips is floating.

FIG. 16 is a cross sectional view F-F of another embodiment in which all of the conductor strips of at least one group are connected by vias, while only some of the conductor strips of at least one other group are connected by vias.

FIG. 17 is a cross sectional view of F-F of another embodiment in which some of the slots between conductor strips are vertically staggered with respect to at least one other conductor strip and aligned with at least one other conductor strip.

FIG. 18A, FIG. 18B and FIG. 18C illustrate another embodiment in which conductor strips formed on different layers of a die seal have slots of different shapes.

Like reference numbers and designations in the various drawings indicate like elements.

DETAILED DESCRIPTION OF THE INVENTION

Figure 1:
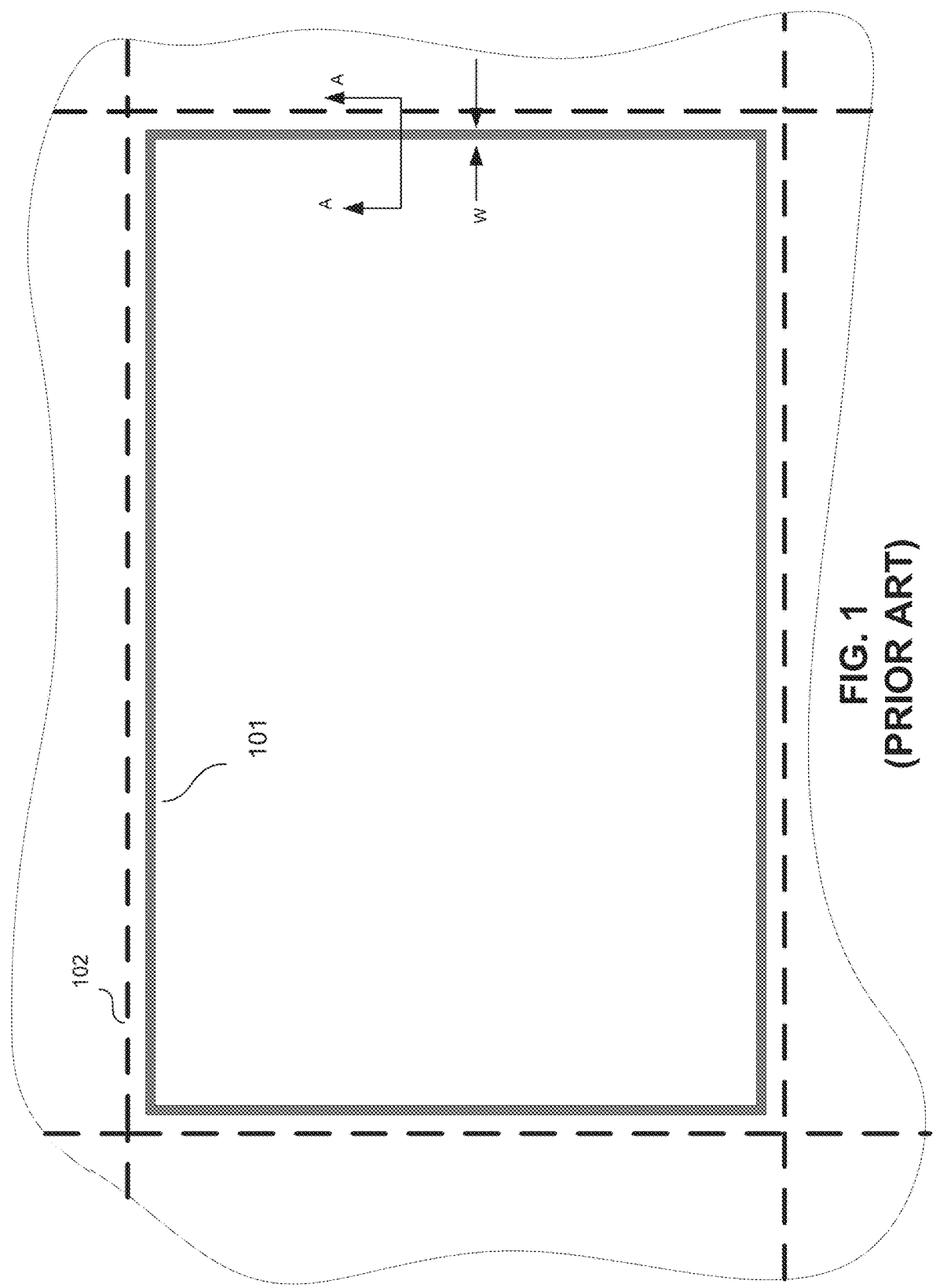
FIG. 1 is an illustration of a prior art die seal that is unbroken and allows Faraday currents to circulate around the die seal.
Figure 2:
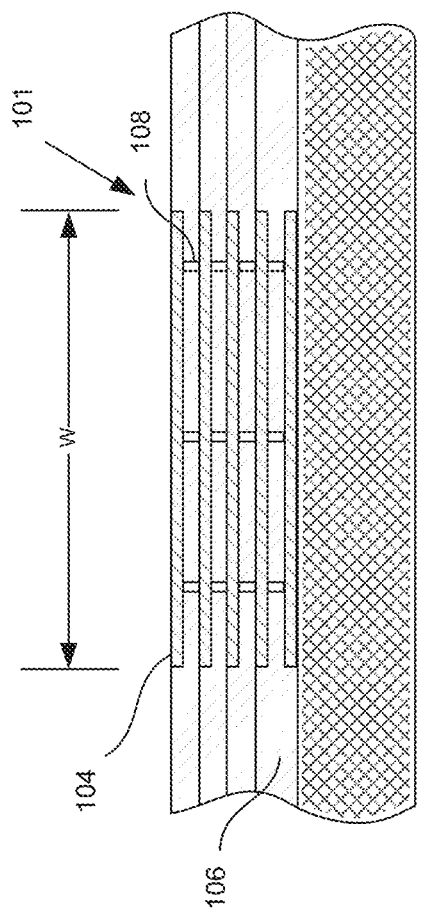
FIG. 2 is a cross section of a portion of the prior art die seal of FIG. 1.
Figure 3:
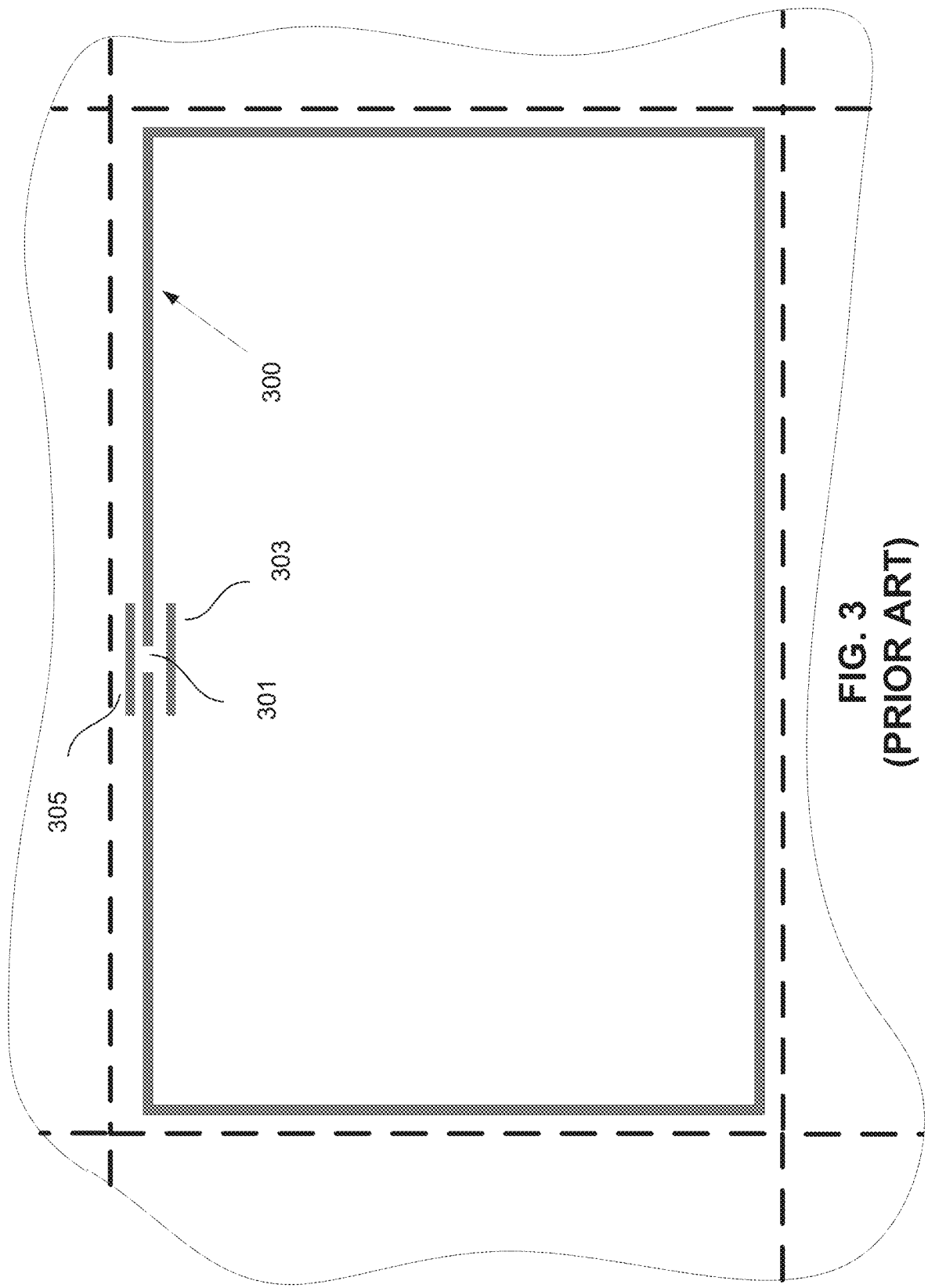
FIG. 3 shows breaking the die seal with a straight slot 301.
Figure 4:
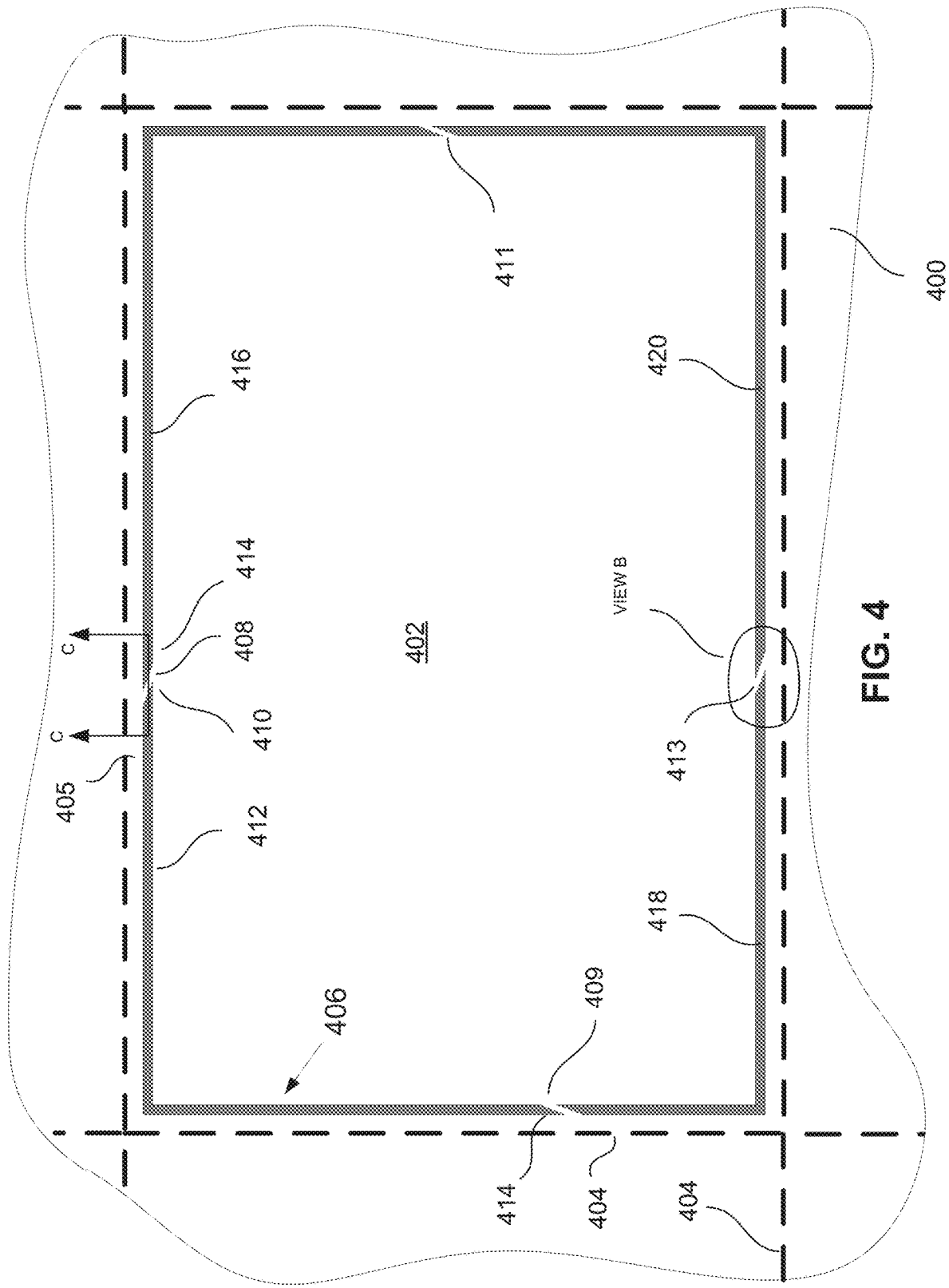
FIG. 4 is a plan view of one embodiment of an integrated circuit chip fabricated on an integrated circuit wafer.

FIG. 4 is a plan view of one of the integrated circuit chips 402 (hereafter referred to as a "chip") fabricated on an integrated circuit wafer 400. Dotted lines represent cut lines 404 that mark where a saw will cut the wafer to separate each of a plurality of chips 402 (only one full chip 402 shown) fabricated on the wafer 400.

A die seal 406 is fabricated on the wafer 400. In some embodiments, the die seal 406 is formed using a plurality of layers of conductive material. The die seal 406 is formed on the interior of, and in proximity to, a perimeter of the chip 402. The perimeter of the chip 402 is defined by the cut lines 404. In some embodiments, the die seal 406 is broken by at least one angled slot 408. In the embodiment shown in FIG. 4, four such angled slots 408, 409, 411, 413 are shown. Each angled slot, such as the slot 408, defines a head 410 of a conductor strip 412 on one side of the angled slot 408 and a tail 414 of at least one conductor strip 416 on the other side of the angled slot 408. In addition, each head 410 and tail 414 extends across the slot. The farthest extension 502, 504 is defined by the sharp points depicted in FIG. 5. Accordingly, each conductor strip 412, 416, 418, 420 has a head at one end and a tail at the other end. Each slot 408, 409, 411, 413 exists between pairs of conductor strips 412, 416, 418, 420 that make up the die seal 406. For example, the conductor strip 412 has a head 410 and the conductor strip 416 has a tail 414, the head 410 and tail 414 each defined by the angled slot 408.

The plan view of FIG. 4 only allows the top layer of each of the four top conductor strips 412, 416, 418, 420 to be seen. In some embodiments, the conductor strips 412, 416, 418, 420 are fabricated from several layers of conductive material (e.g., metal layers) that are also used to form the circuits and conductive traces on the integrated circuit 402.

Figure 5:
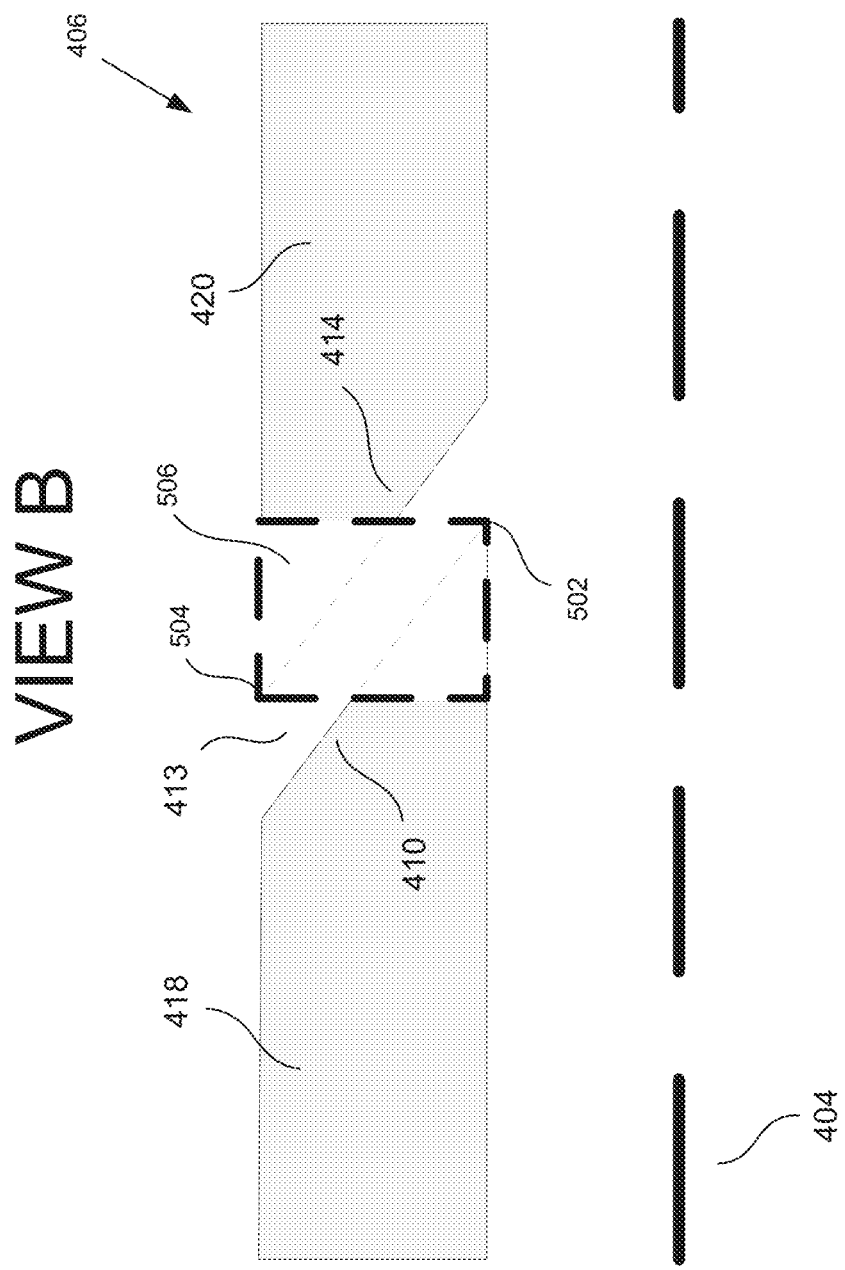
FIG. 5 is a detailed illustration of view B from FIG. 4, showing details of the angled slot.

FIG. 5 is a detailed illustration of view B from FIG. 4, showing details of the angled slot 413. In some embodiments, the farthest extension 502 of the head 410 of at least one of the conductor strips 418 extends beyond the farthest extension 504 of the tail 414 of a horizontally adjacent conductor strip 420. This eliminates any clear path for an edge crack to propagate along a line perpendicular to the die seal 406. That is, the head of one conductor strip 418 overlaps with the tail 414 of the adjacent conductor strip 420 within a section 506 of the die seal 406. One of the benefits of having a die seal is that when the chips are separated by sawing (or other possible means) along the cut lines 404, cracks in various layers of the chip that might propagate inward from the die edge as a result of the cutting operation will terminate at the die seal 406. Accordingly, the die seal 406 provides a protective seal around the chip to inhibit cracks from propagating into the interior of the chip. By providing angled slots 408, 409, 411, 413, electrical continuity around the die seal is broken. Nonetheless, the die seal 406, having angled slots 408, 409, 411, 413, still significantly increases the likelihood that any cracks that might form during the cutting operation will terminate at the outside edge of the die seal 406 and not propagate past the die seal 406 to the interior of the chip 402.

Figure 6:
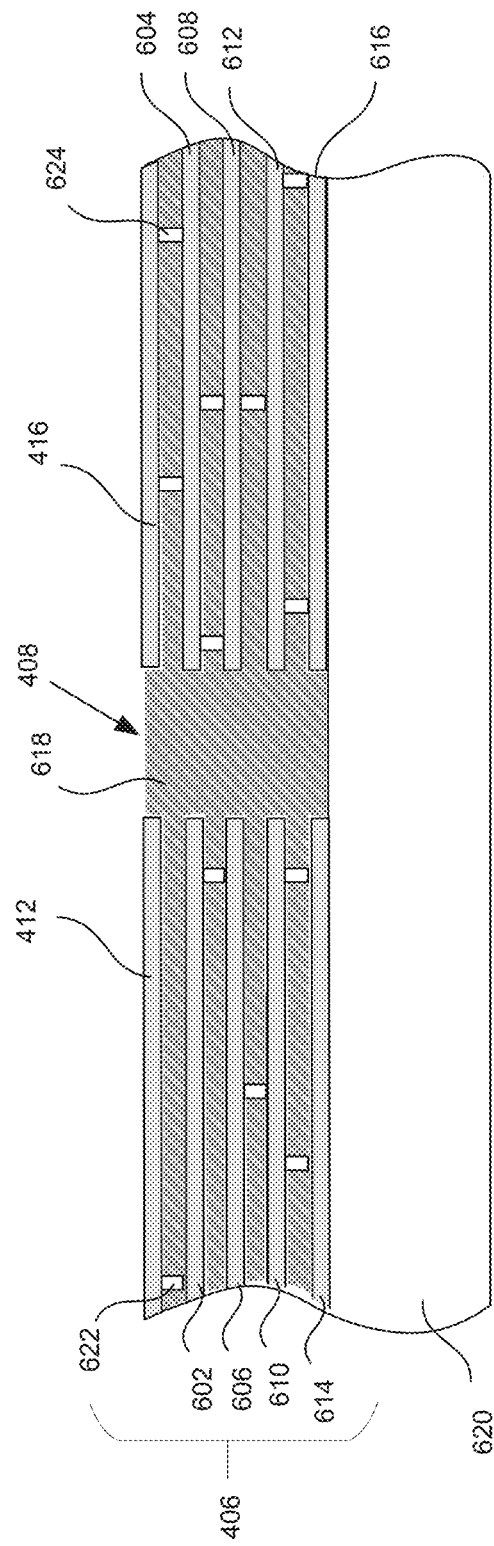
FIG. 6 is a cross sectional view taken along the line C-C.

FIG. 6 is a cross sectional view taken along the line C-C of FIG. 4. The angled slot 408 is formed at the top layer by the conductor strips 412, 416. Conductor strips 602, 604 at a second layer which is not visible in FIG. 4 and FIG. 5 lie on opposite sides of the angled slot 408 vertically adjacent to and aligned with the conductor strips 412, 416, respectively, of the top layer of the die seal 406. Additional conductors strips 606, 608, 610, 612, 614, 616 reside on additional layers and further define the angled slot 408. In some embodiments, a dielectric or passivation material 618 fills both the angled slot 408 and a space that resides between the layers of conductor strips 412, 416, 602, 604, 606, 608, 610, 612, 614, 616. A substrate 620 resides beneath the lowest conductor strip 614, 616. In some embodiments, a first set of conductor strips 412, 602, 606, 610, 614 are electrically connected to one another by vias 622 (i.e., conductive connections that provide an electrical conduction path through the dielectric 618 from one conductive layer to another conductive layer). Conductive vias 622 electrically and mechanically connect the different metal layers of the die seal 406. (It should be noted that several such vias are shown, but only two of these vias 622, 624 are labeled with reference numbers for the sake of simplicity). In some such embodiments, the vias are provided in accordance with design rules for the fabrication of the integrated circuits. Such vias can be useful in providing structural integrity to the integrated circuit. The via pitch (i.e., spacing of the vias over the length of the conductor strips) can be selected to meet various criteria, including ensuring that the architecture adheres to the appropriate design rules for the fabrication process being used to fabricate the integrated circuit.

Figure 7:
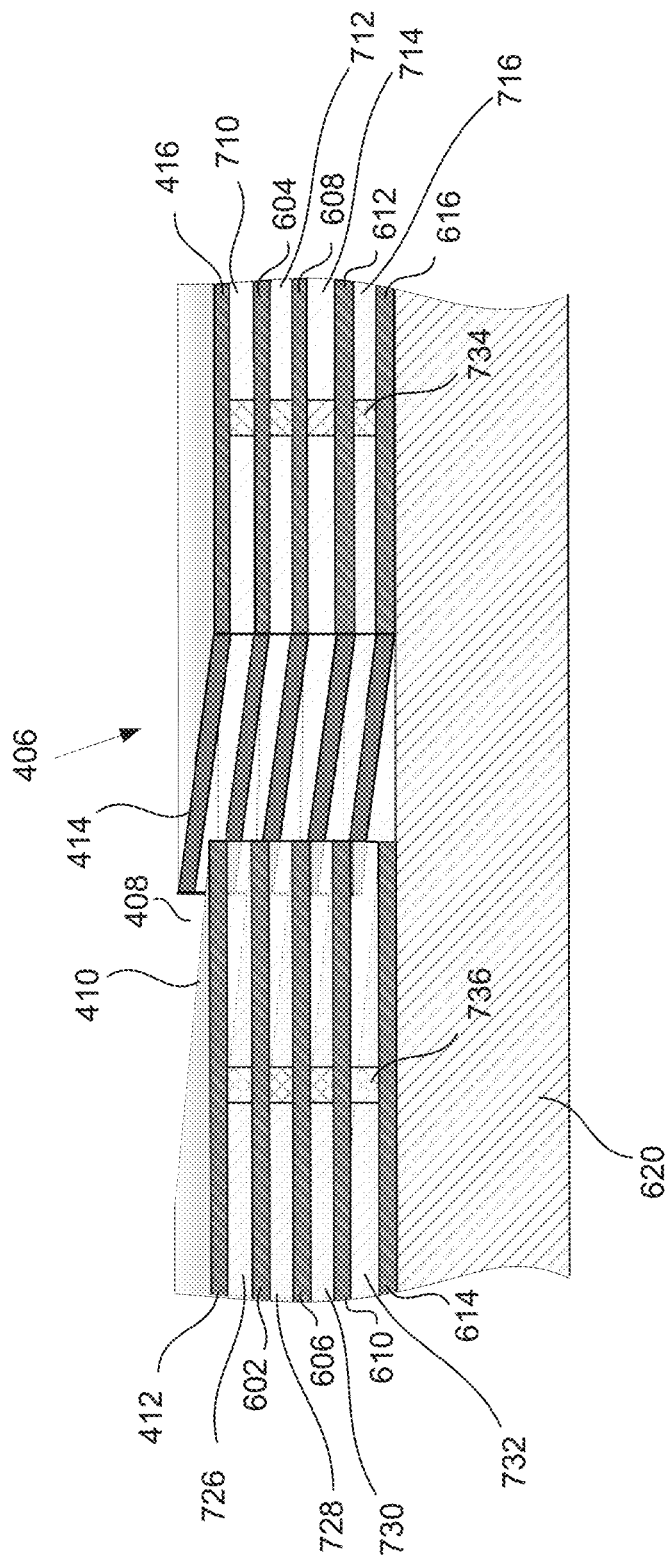
FIG. 7 is a cross-sectional view along line C-C showing the die seal and one of the angled slots.

FIG. 7 is a perspective view along the same line C-C, however showing the die seal 406 and one of the angled slots 408 for each of the metal layers in perspective view. The perspective view of FIG. 7 exposes the angled nature of the slot 408, which is hard to see in the view of FIG. 6. While the intervening insulating layers 710, 712, 714, 716 formed beneath the top conductor strips 412, 416 are also exposed, for the sake of simplicity in the drawing, the insulating material 622 that resides within the angled slot 408 is not expressly shown in FIG. 7. However, this material resides in some embodiments, nonetheless. The material within the slot 408 may be the same as the material present between the conductive strips. However, in an alternative embodiment, the material within the slot 408 may be different. It should be noted that in some embodiments, passivation material might be provided above the top metal layer. Such passivation material is not shown for the sake of simplicity. The vertically adjacent conductor strips 416, 604, 608, 612, 616 each have a tail 414 defined by the angled slot 408. The conductor strips 602, 606, 610, 614 that are vertically adjacent to the top conductor strip 412 each have a head 410 defined by the angled slot 408.

The angled slots 408, 409, 411, 413 electrically isolate the heads on one side of the angled slot from tails on the other side of the angled slot. Being electrically isolated means that current cannot pass through the angled slot that separates the head from the tail of a horizontally adjacent conductor strip (a conductor strip on the same horizontal layer separated by an angled slot). While FIG. 4 shows an embodiment in which there are four such angled slots 408, 409, 411, 413, other embodiments may have any number of such angled slots greater than one. In embodiments with one angled slot, there is an electrical connection between the head and the horizontally adjacent tail (i.e., the tail of the same conductor strip). However, current cannot circulate around the die seal due to break in the electrical path between the head and tail created by the angled slot, which breaks the Faraday ring that would otherwise be present.

In some embodiments, the vias 622 are vertically staggered, i.e., not vertically aligned, as shown in FIG. 6. However, in some embodiments, the vias 734 are vertically aligned, as shown in FIG. 7. FIGS. 11 and 14-16 (which are discussed in greater detail below) show further examples of embodiments in which the vias are vertically staggered. In some embodiments, the head 410 of each conductor strip 412 is vertically aligned with the head 410 of each electrically connected vertically adjacent conductor strip 412, 602, 606, 610, 614. In some embodiments, some or all of the vertically adjacent conductor strips 412, 602, 606, 610, 614 are not electrically and/or mechanically connected to one or more of the other vertically adjacent conductor strips. In some cases, one or more of the conductor strips 412, 416, 602, 604, 606, 608, 610, 612, 614, 616 are connected to a particular potential, such as ground.

Figure 8:
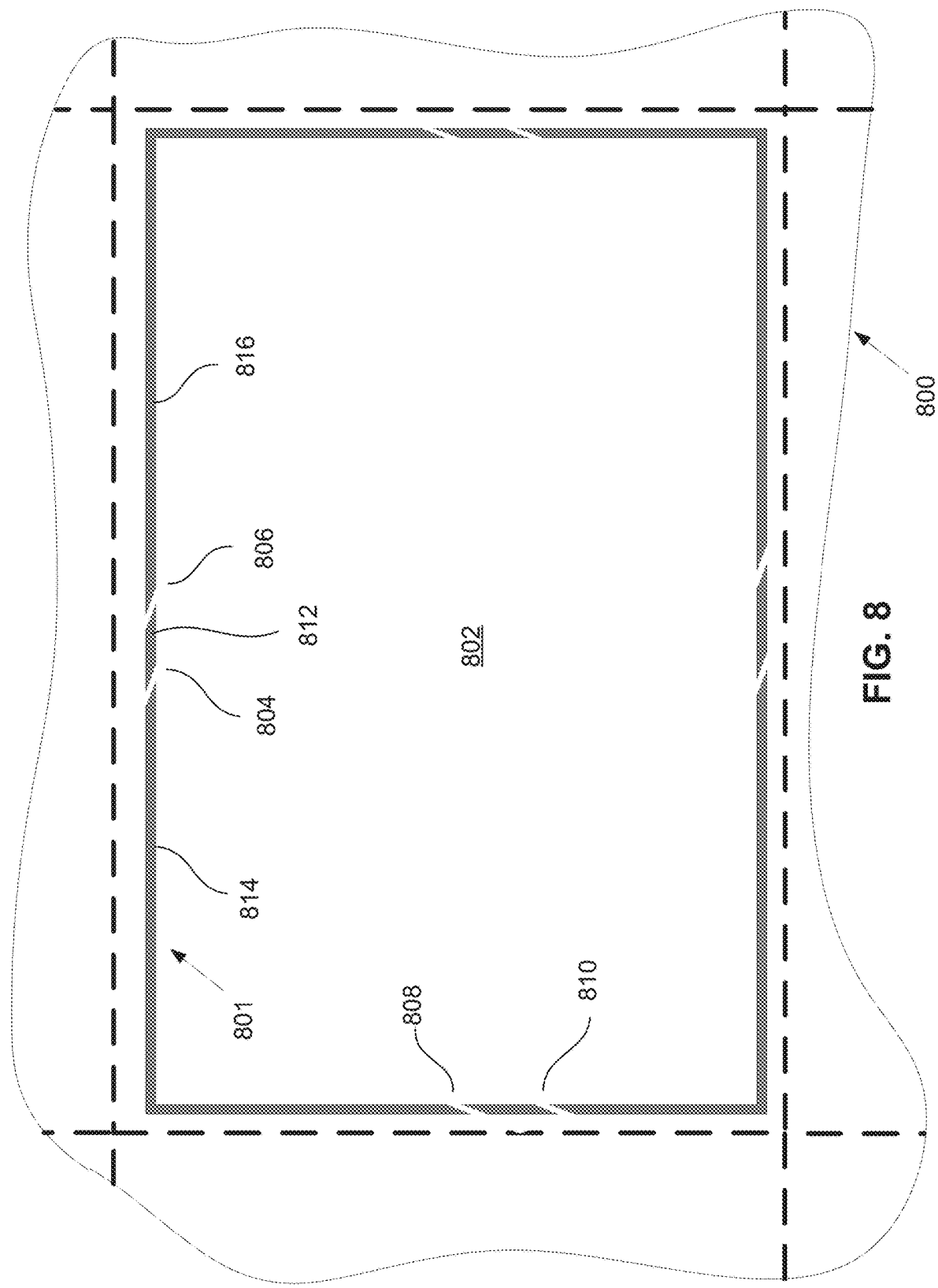
FIG. 8 is a plan view of a portion of a wafer on which a chip is fabricated.

FIG. 8 is a plan view of a portion of a wafer 800 on which a chip 802 is fabricated. In the embodiment shown in FIG. 8, a die seal 801 comprises pairs of angled slots 804, 806, 808, 810. The two slots 804, 806 within a first pair are in relatively close proximity to one another with respect to angled slots 808, 810 of a second pair comprising slots 804, 806. For example, conductor strips 812 between the pair of angled slots 804, 806 are relatively short with respect to the conductor strips 814, 816 between slots 804, 808 that are not of the same pair. In some embodiments, the conductor strip 812 is less than one-quarter the length of the conductor strip 814, 816.

Figure 9:
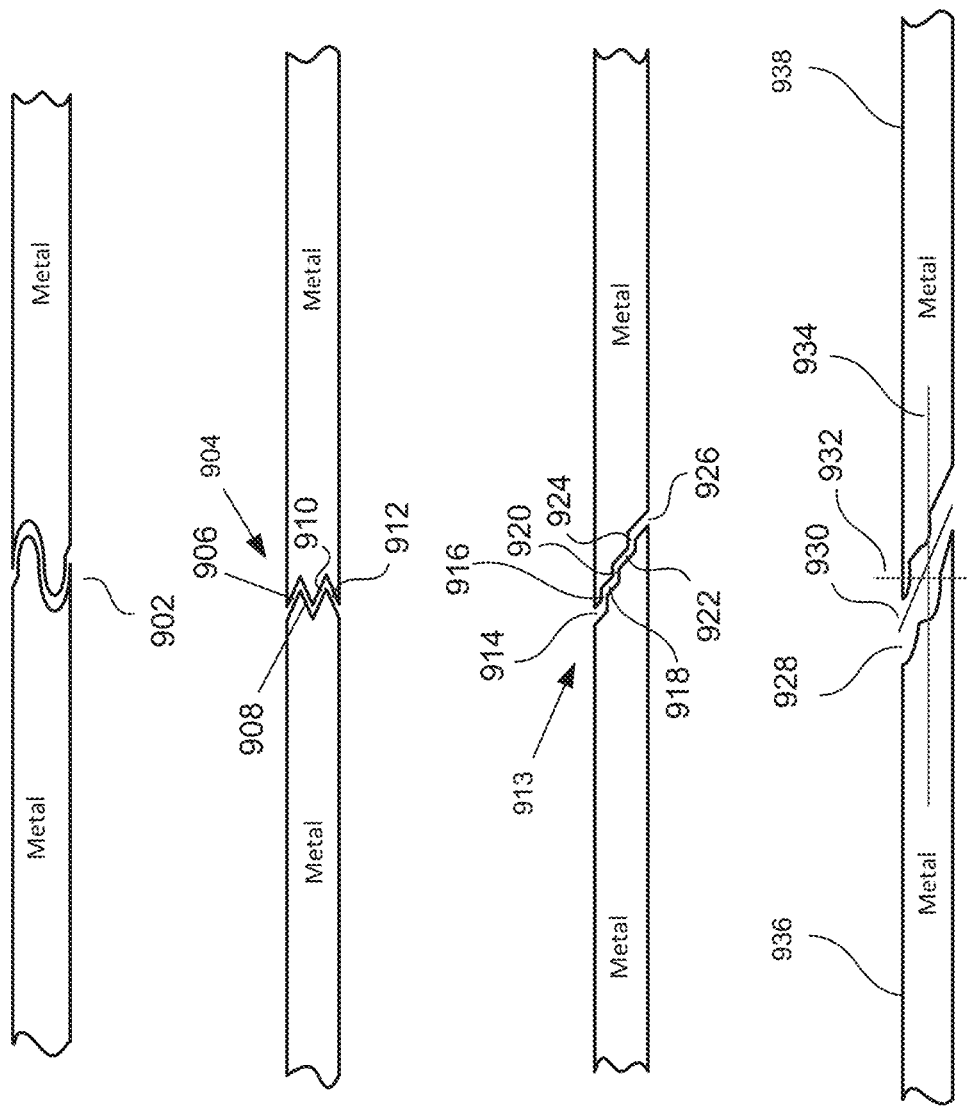
FIG. 9 is an illustration of several different angled slots that can be used in any of the embodiments disclosed herein.

FIG. 9 is an illustration of several different angled slots that can be used in any of the embodiments disclosed herein. A first of these angled slots 902 shown in FIG. 9 has a curved slot. An angled slot 904 in accordance with another embodiment has a plurality of connected angled slot sections 906, 908, 910, 912, each of which is essentially straight and forming a chevron configuration. In another embodiment, the angled slot 913 comprises a plurality of slot sections 914, 916, 918, 920, 922, 924, 926, each essentially straight and forming a "stair step" configuration. In another embodiment, the angled slot 928 comprises at least one slot section having an essentially arbitrary shape that begins at the proximal end of a transverse axis 930 and that ends at a distal end of the transverse axis 930. The angle of the transverse axis 930 ensures that there is no clear path through the angled slot 928 along any line (such as line 932) perpendicular to the longitudinal axis 934 of the conductor strips 936, 938 on the two sides of the angled slot 928.

Figure 10:
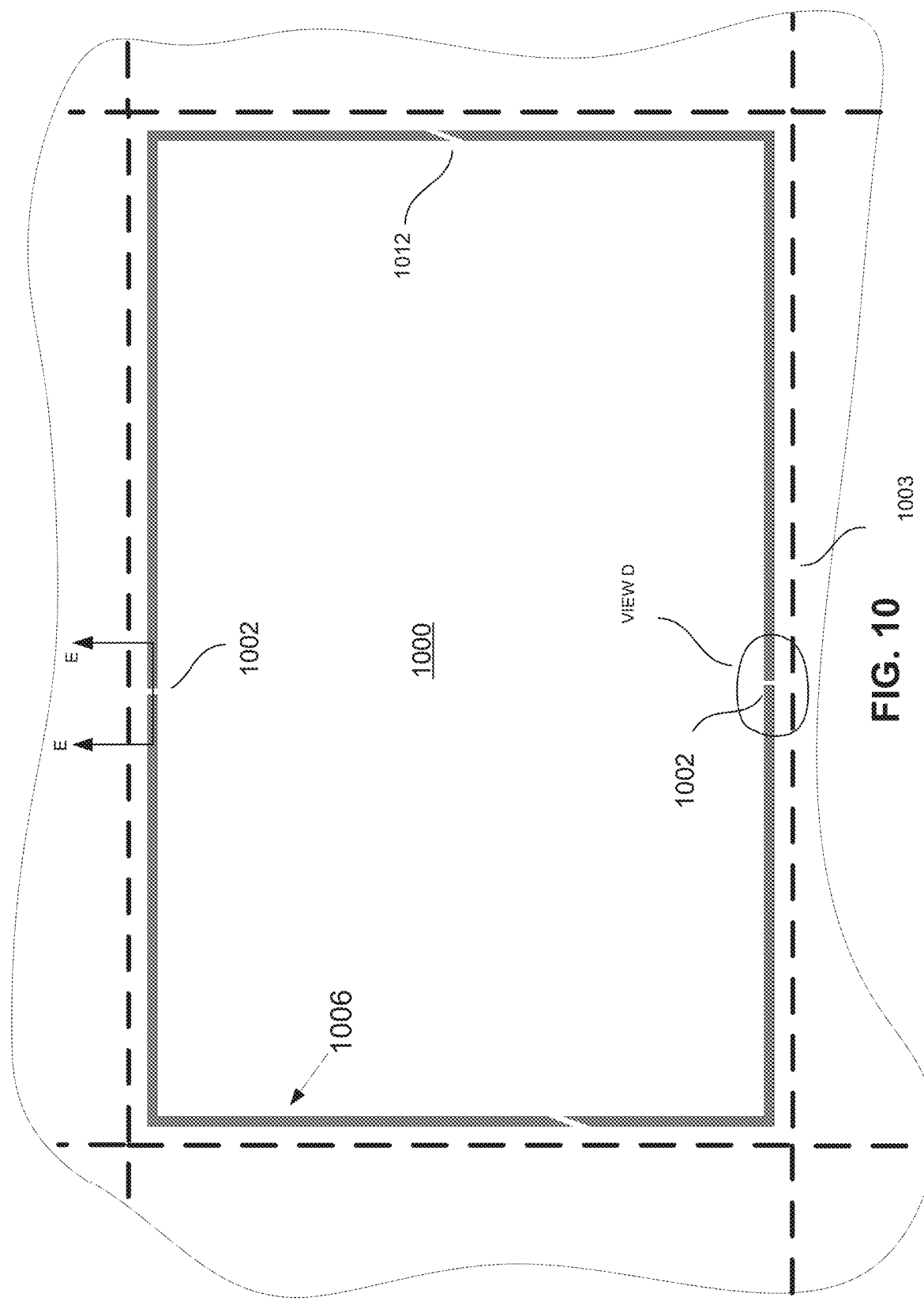
FIG. 10 is a plan view of an integrated circuit chip.

FIG. 10 is a plan view of a chip 1000. At least one of the slots 1002 is perpendicular to the longitudinal axis of the die seal 1006. A cut line 1003 is shown as a dotted line around the periphery of the chip 1000. In some embodiment, at least one slot 1012 is an angled slot, similar to those described above.

Figure 11:
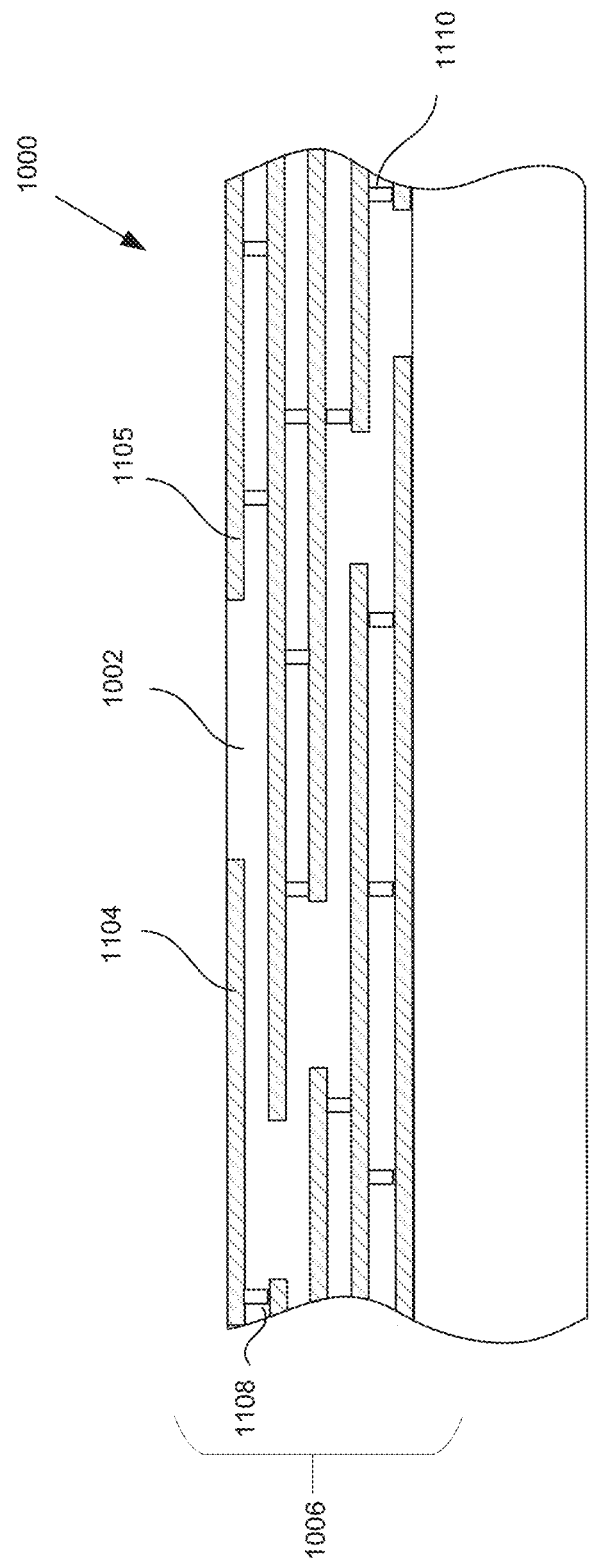
FIG. 11 is a cross sectional view of a portion of the chip 1000 taken along line E-E in accordance with another embodiment of the disclosed method and apparatus.

FIG. 11 is a cross sectional view of a portion of the chip 1000 taken along line E-E in accordance with another embodiment of the disclosed method and apparatus. In chip 1000, slots 1002 that separate conductor strips 1104 from conductor strips 1105 in each layer of a die seal 1006 are vertically staggered such that no two vertically adjacent slots 1002 are aligned, thereby reducing or entirely eliminating the remote possibility that a crack could penetrate down an aligned set of slots, such as depicted in FIG. 6.

In some embodiments, the slots are perpendicular to the longitudinal axis of the die seal. In other embodiments, the slots are angled, as shown in FIGS. 5 and 8. In some such embodiments, while some slots are vertically staggered, others may be vertically aligned. Vias 1108 electrically connect vertically adjacent conductor strips 1104 that reside on the left side of the slots 1002. Similarly, in some embodiments, vias 1110 on the right side of the slots 1002 electrically connect conductor strips 1105 with vertically adjacent conductor strips 1105 on the right side of the slot 1002. That is, each of the conductor strips 1104 on the left side (as seen in FIG. 11) of the slots 1002 is electrically connected by vias 1108 (it should be noted that one via 1108 between the conductor strip 1104 on the second layer and the third layer is not shown in FIG. 11). Each of the conductor strips 1105 on the right side of the slots 1002 is electrically connected by vias 1110. However, the conductor strips 1104 are electrically isolated from the conductor strips 1105 on the other side of the slots 1002. Thus, current cannot circulate around the die seal 1006 and an edge crack is virtually unable to penetrate across the die seal, shown in FIG. 11.

Figure 12:
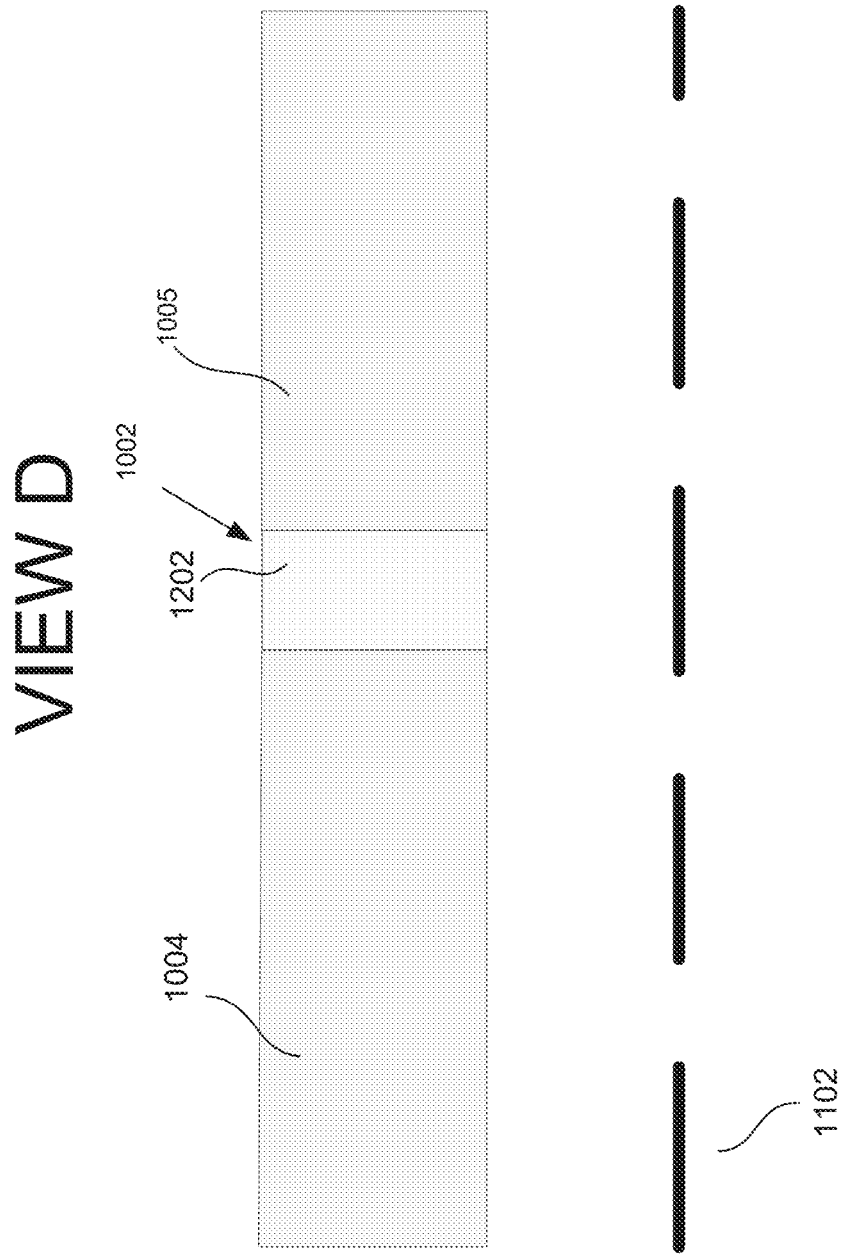
FIG. 12 is a plan view D of the area around the perpendicular slot shown in FIG. 11.

FIG. 12 is a plan view D of the area around the perpendicular slot 1002. From the top view, the slot can be seen to be filled with a dielectric or passivation material 1202.

Figure 13:
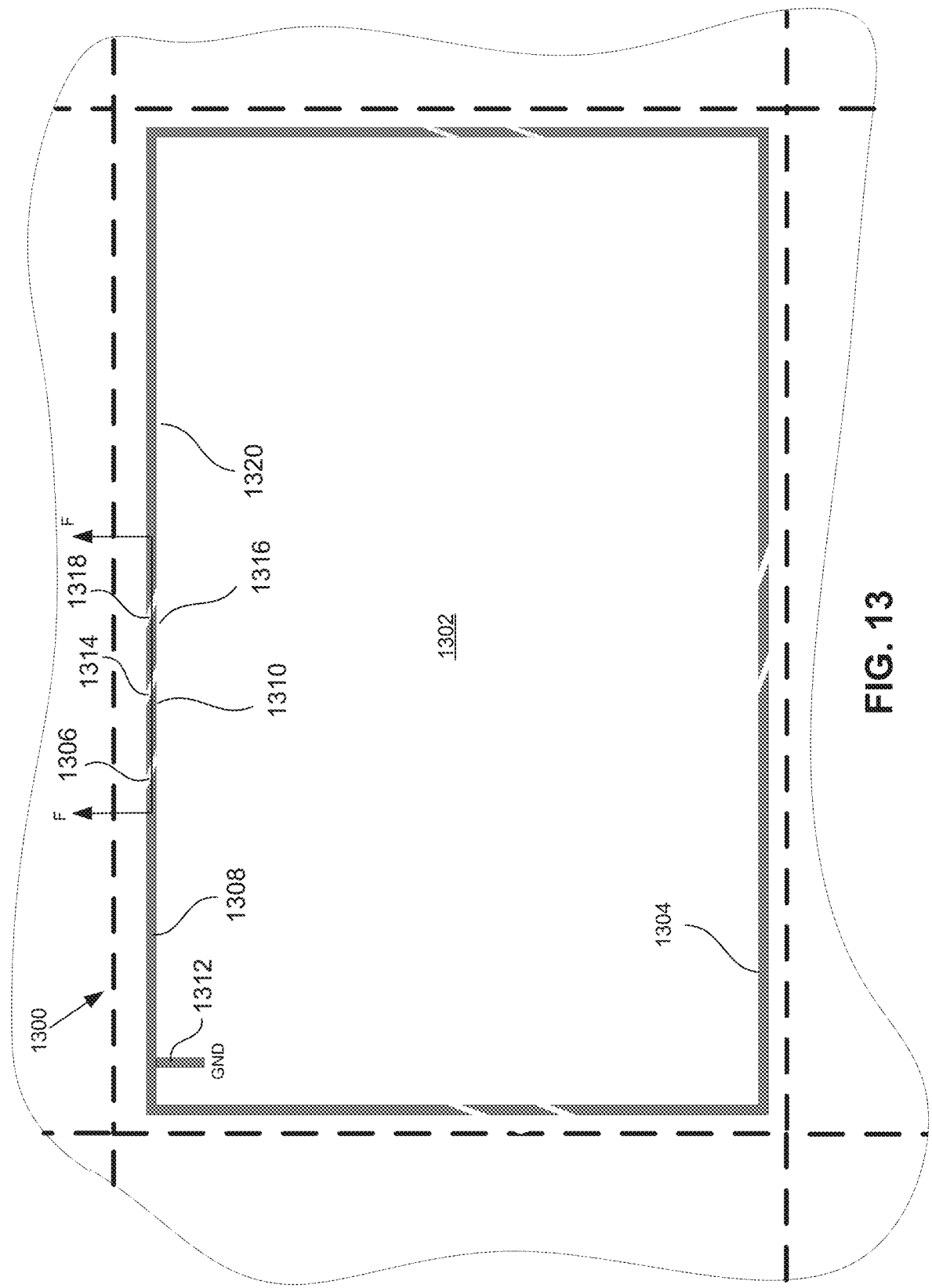
FIG. 13 is a top view of a die having a chip with a die seal having nine slots.

FIG. 13 is a top view of a wafer 1300 having a chip 1302 with a die seal 1304 having nine slots. A first of the slots 1306 provides electrical isolation between a first conductor strip 1308 on the top layer of the die seal 1304 from a horizontally adjacent conductor strip 1310. The conductor strip 1308 is coupled to ground or other electrical potential by a conductor strip 1312. Other conductor strips similar to 1312 may be used to ground some or all of the other otherwise floating conductor strips comprising the die seal 1304. A second slot 1314 provides electrical isolation between the second conductor strip 1310 on the top layer of the die seal 1304 and a horizontally adjacent third conductor strip 1316. A third slot 1318 provides electrical isolation between the third conductor strip 1316 on the top layer of the die seal 1304 and a horizontally adjacent fourth conductor strip 1320. It should be noted that in some embodiments, one of more of the slots might be made at an angle or shape that differs from one or more of the other slots. Furthermore, it should be clear that the particular number of slots provided might vary in different embodiments.

Figure 14:
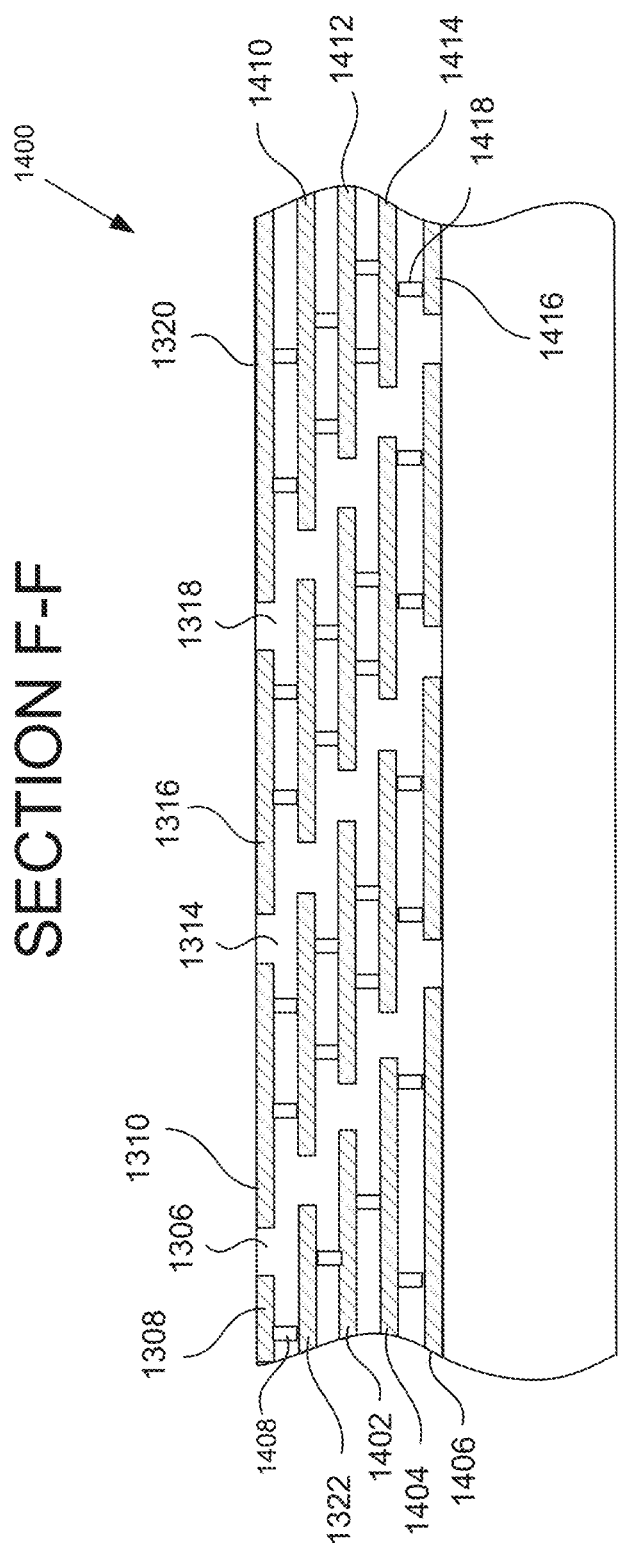
FIG. 14 is a cross sectional view F-F of a portion of the die.

FIG. 14 is a cross sectional view F-F of a portion 1400 of the die 1302. A conductor strip 1322 fabricated on the second layer (counting down from the top layer) of the die seal 1304 extends under slot 1306 (see FIG. 13). It should be noted that while the slots 1306, 1314, 1318 are shown in FIG. 13 to be angled slots, as described earlier, since these slots are vertically staggered (as shown in FIG. 14), they may alternatively be formed as perpendicular slots (i.e., orthogonal to the metal lines) without creating clear paths for edge cracks to propagate. A first group of vertically adjacent conductor strips 1308, 1322, 1402, 1404, 1406 is electrically connected by vias 1408. A second group of vertically adjacent conductor strips 1320, 1410, 1412, 1414, 1416 is electrically connected by vias 1418. Several such groups of conductor strips may be provided, such as those shown in FIG. 11 connected to conductor strips 1310, 1316. In some embodiments, the placement (e.g., pitch) of the family of vias 1408, 1418 may depend upon design rules for the particular fabrication process. While some such groups of conductor strips may be coupled to ground or other electrical potential, other groups may float (i.e., are not be connected to any other circuitry).

FIG. 15 is a cross sectional view F-F similar to that of FIG. 14, but in which each of the conductor strips 1501 of at least one group of conductor strips electrically float.

FIG. 16 is a cross sectional view F-F of another embodiment in which the conductor strips 1602 of at least one group are connected to one another by vias 1604, while the conductor strips 1606 of at least one other group are connected by vias 1608.

FIG. 17 is a cross sectional view of F-F of another embodiment in which some of the slots that separate conductor strips 1702 are vertically staggered with respect to at least one other conductor strip 1704 and aligned with at least one other conductor strip 1706. In some such embodiments in which at least some of the slots are vertically staggered, the slots are perpendicular to the longitudinal axis of the die seal, similar to the perpendicular slots shown in FIG. 12. In other embodiments, the slots are angled, as shown in FIGS. 5 and 8. In some such embodiments, while some slots are vertically staggered, others may be vertically aligned. It should be noted that due to the two-dimensional cross-sectional view of FIG. 17, it is not possible to tell whether the shape of the slots (i.e., whether they are straight angled slots, as shown in FIG. 5, curved angled slots, as shown in FIG. 9, or perpendicular slots, as shown in FIG. 12).

FIG. 18A, FIG. 18B and FIG. 18C illustrate another embodiment in which conductor strips 1802, 1803 1804, 1805, 1806, 1807 formed on different layers of a die seal have slots 1808, 1810, 1812 of different shapes.

FIG. 18A illustrates a first conductor strip 1802 and a second conductor strip 1803 formed on a first layer with a perpendicular slot 1808 (i.e., at an angle of 90 degrees with respect to the longitudinal axis 1809). The perpendicular slot 1808 is located between the two conductor strips 1802, 1803.

FIG. 18B illustrates a third and fourth conductor strip 1804, 1805 formed on the second layer (either above or below the conductor strips 1802, 1803 of the first layer). An angled slot 1810 with an angle θ greater than 90° with respect to the longitudinal axis 1809 of the die seal is located between the two conductor strips 1804, 1805.

FIG. 18C illustrates a fifth and sixth conductor strip 1806, 1807 formed on a third layer (either above or below the conductor strips 1802, 1803, 1804, 1805 the first and second layers). An angled slot 1810 with an angle φ less than 90° with respect to the longitudinal axis 1809 of the die seal is located between the two conductor strips 1806, 1807.

The slots 1808, 1810, 1812 may be vertically aligned, one on top of the other, or vertically staggered. If aligned, having different shapes prevents cracks that might form during a dicing operation from running across the die seal and degrading the integrity of the chip within the die seal. FIGS. 18A, 18B, 18C merely provide one example of a die seal that has slots of different shapes on different layers. Such a die seal can comprise any number of layers on which conductor strips are formed having different shaped slots between the conductor strips of each layer. Furthermore, the example in which the slots include a perpendicular slot and an angled slot is merely one example. In other embodiments, some, or all of the slots may be curved slots (shown in FIG. 9, for example), each slot having a different shape from the slots that are vertically adjacent (i.e., aligned on the layer directly above or below).

In each of the embodiments shown in FIGS. 4, 8, 11, and 13, any of the slots' shapes shown in FIG. 9 may be used.

In some such embodiments, combinations of differently such shaped slots may be used. Furthermore, in those embodiments in which the slots are vertically staggered, perpendicular slots maybe used as well for some or all of the slots in each layer of the die seal.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A die seal formed on an integrated circuit chip, the die seal comprising:
   (a) a plurality of conductor strips formed on insulating layers of the integrated circuit chip fabricated on a wafer, the conductor strips forming the die seal in proximity to a perimeter of the chip, at least two of the conductor strips broken by at least one angled slot, each such angled slot defining a head of a first of the broken conductor strips on one side of the angled slot and a horizontally adjacent tail of a second of the broken conductor strips on the other side of the angled slot, the angled slots electrically isolating each head from the horizontally adjacent tail;
   (b) a plurality of conductive connection vias, each providing electrical and mechanical coupling from a first of the plurality of conductor strips to at least a second of the plurality of conductor strips, the at least a second of the plurality of conductor strips being vertically adjacent to the first of the plurality of conductor strips.

2. The die seal of claim 1, wherein the head of each conductor strip is vertically aligned with the head of each electrically connected vertically adjacent conductor strip.

3. The die seal of claim 1, wherein the head of each conductor strip is not vertically aligned with the head of at least one vertically adjacent conductor strip.

4. The die seal of claim 1, wherein the farthest extension of the head of each conductor strip extends beyond the farthest extension of the tail of at least one conductor strip formed on a different layer, thereby eliminating any clear path orthogonal to each conductive strip for an edge crack to propagate through the die seal.

5. The die seal of claim 4, wherein the die seal has at least two angled slots defining an end of at least a first and second conductor strip on each conductive layer.

6. A die seal formed on an integrated circuit, the die seal comprising:
   (a) a plurality of conductor strips formed on insulating layers of an integrated circuit chip fabricated on a wafer, the conductor strips forming the die seal in proximity to a perimeter of the chip, at least two of the conductor strips terminating at a slot, each such slot defining a head of a first of the terminated conductor strips on one side of the slot and a horizontally adjacent tail of a second of the terminated conductor strips on the other side of the slot, the slots electrically disconnecting each head from the horizontally adjacent tail; and (b) a plurality of conductive connection vias, each providing electrical and mechanical coupling from a first of the plurality of conductor strips to at least a second of the plurality of conductor strips, the at least a second of the plurality of conductor strips being vertically adjacent to the first of the plurality of conductor strips;

wherein the head of each conductor strip is not vertically aligned with the head of at least one other vertically adjacent conductor strip.

7. The die seal of claim 6, wherein at least one of the slots is an angled slot.

8. The die seal of claim 6, wherein the farthest extension of the head of each conductor strip extends beyond the farthest extension of the tail of at least one conductor strip formed on a different layer, thereby eliminating any clear path orthogonal to each conductive strip for an edge crack to propagate through the die seal.

9. The die seal of claim 8, wherein at least one layer of the die seal has at least two angled slots defining an end of at least a first and second conductor strip.

10. The integrated circuit chip of claim 6, wherein at least one of the conductor strips is coupled to ground or other electrical potential.

11. An integrated circuit chip having a die seal formed thereon, the die seal comprising:
   (a) a plurality of conductor strips formed on insulating layers of an integrated circuit chip fabricated on a wafer, the conductor strips forming the die seal in proximity to a perimeter of the chip, at least two of the conductor strips terminating at an angled slot, each such angled slot defining a head of a first of the terminated conductor strips on one side of the angled slot and a horizontally adjacent tail of a conductor strip on the other side of the angled slot, the angled slots electrically isolating each head from the horizontally adjacent tail;
   (b) a plurality of conductive connection vias, each providing electrical and mechanical coupling from a first of the plurality of conductor strips to at least a second of the plurality of conductor strips, the at least a second of the plurality of conductor strips being vertically adjacent to the first of the plurality of conductor strips.

12. The integrated circuit chip of claim 11, wherein the head of each conductor strip is vertically aligned with the head of each vertically adjacent conductor strip.

13. The integrated circuit chip of claim 11, wherein the head of each conductor strip is not vertically aligned with the head of at least one conductor strip formed on a different layer.

14. The integrated circuit chip of claim 11, wherein the farthest extension of the head of each conductor strip extends beyond the farthest extension of the tail of a conductor strip formed on a different layer, thereby eliminating any clear path orthogonal to each conductive strip for an edge crack to propagate through the die seal.

15. The integrated circuit chip of claim 11, wherein the die seal has at least two angled slots defining an end of at least a first and second conductor strip on each conductive layer, the length of the first conductor strip being at least one-fourth the length of the second conductor strip formed on the same conductive layer.

16. An integrated circuit chip having a die seal formed thereon, the die seal comprising:
   (a) a plurality of conductor strips formed on insulating layers of an integrated circuit chip fabricated on a wafer, the conductor strips forming the die seal in proximity to a perimeter of the chip, at least two of the conductor strips terminating at a slot, each such slot defining a head of a first of the terminated conductor strips on one side of the slot and a horizontally adjacent tail of a second of the terminated conductor strips on the other side of the slot, the slots electrically isolating each head from the horizontally adjacent tail;
   (b) a plurality of conductive connection vias, each providing electrical and mechanical coupling from a first of the plurality of conductor strips to at least a second of the plurality of conductor strips, the at least a second of the plurality of conductor strips being vertically adjacent to the first of the plurality of conductor strips;

wherein the head of each conductor strip is not vertically aligned with the head of at least one conductor strip formed on a different layer.

17. The die seal of claim 16, wherein at least one of the slots is an angled slot.

18. The die seal of claim 16, wherein the farthest extension of the head of at least one conductor strip extends beyond the farthest extension of the tail of a conductor strip formed on a different layer, thereby eliminating any orthogonally clear path for an edge crack to propagate through the die seal.

19. The die seal of claim 18, wherein at least one layer of the die seal has at least two angled slots defining an end of at least a first and second conductor strip.

20. The integrated circuit chip of claim 18, wherein at least one of the conductor strips is coupled to ground or other electrical potential.

* * * * *